United States Patent
Benjaminson et al.

(10) Patent No.: US 11,217,462 B2
(45) Date of Patent: ***Jan. 4, 2022

(54) BOLTED WAFER CHUCK THERMAL MANAGEMENT SYSTEMS AND METHODS FOR WAFER PROCESSING SYSTEMS

(71) Applicant: Applied Materials, Inc., Santa Clara, CA (US)

(72) Inventors: David Benjaminson, Santa Clara, CA (US); Dmitry Lubomirsky, Cupertino, CA (US); Ananda Seelavanth Math, Bangalore (IN); Saravanakumar Natarajan, Coimbatore (IN); Shubham Chourey, Indore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,109

(22) Filed: Mar. 30, 2020

(65) Prior Publication Data

US 2020/0273728 A1 Aug. 27, 2020

Related U.S. Application Data

(63) Continuation of application No. 16/209,581, filed on Dec. 4, 2018, now Pat. No. 10,607,867, which is a
(Continued)

(51) Int. Cl.
*H01J 37/32* (2006.01)
*H01L 21/67* (2006.01)
(Continued)

(52) U.S. Cl.
CPC .. *H01L 21/67103* (2013.01); *H01J 37/32082* (2013.01); *H01J 37/32357* (2013.01);
(Continued)

(58) Field of Classification Search
CPC ......... H01L 21/67103; H01L 21/68742; H01L 21/68785; H01L 21/324; H01J 37/32082; H01J 37/32724; H01J 37/32357
(Continued)

(56) References Cited

U.S. PATENT DOCUMENTS 5,835,334 A  11/1998 McMillin et al.
7,297,894 B1 * 11/2007 Tsukamoto ....... H01L 21/67103
118/724
(Continued)

FOREIGN PATENT DOCUMENTS

CN      2917466 Y    7/2007
JP    2006-080148 A  3/2006
(Continued)

OTHER PUBLICATIONS

International Search Report and Written Opinion dated Nov. 17, 2016 in International Patent Application No. PCT/US2016/045543, 14 pages.
(Continued)

*Primary Examiner* — Vu A Vu
(74) *Attorney, Agent, or Firm* — Kilpatrick Townsend & Stockton LLP

(57) ABSTRACT

A workpiece holder includes a puck, first and second heating devices in thermal communication with respective inner and outer portions of the puck, and a thermal sink in thermal communication with the puck. The first and second heating devices are independently controllable, and the first and second heating devices are in greater thermal communication with the puck, than thermal communication of the thermal sink with the puck. A method of controlling temperature distribution of a workpiece includes flowing a heat exchange fluid through a thermal sink to establish a reference temperature to a puck, raising temperatures of radially
(Continued)

inner and outer portions of the puck to first and second temperatures greater than the reference temperature, by activating respective first and second heating devices disposed in thermal communication with the radially inner and outer portions of the puck, and placing the workpiece on the puck.

19 Claims, 10 Drawing Sheets

Related U.S. Application Data continuation of application No. 15/581,545, filed on Apr. 28, 2017, now Pat. No. 10,147,620, which is a continuation of application No. 14/820,422, filed on Aug. 6, 2015, now Pat. No. 9,691,645.

(51) Int. Cl.
 *H01L 21/687* (2006.01)
 *H01L 21/324* (2006.01)

(52) U.S. Cl.
 CPC ...... *H01J 37/32724* (2013.01); *H01L 21/324* (2013.01); *H01L 21/68742* (2013.01); *H01L 21/68785* (2013.01)

(58) Field of Classification Search
 USPC ........................................................ 438/795
 See application file for complete search history.

(56) References Cited

U.S. PATENT DOCUMENTS

| | | | |
|---|---|---|---|
| 7,361,865 B2 | 4/2008 | Maki et al. | |
| 7,867,926 B2 | 1/2011 | Satoh et al. | |
| 8,329,262 B2 | 12/2012 | Miller et al. | |
| 8,390,980 B2* | 3/2013 | Sansoni | H01L 21/6833 361/234 |
| 8,633,423 B2* | 1/2014 | Lin | H01L 21/67109 156/345.52 |
| 9,691,645 B2* | 6/2017 | Benjaminson | H01L 21/324 |
| 9,741,593 B2 | 8/2017 | Benjaminson et al. | |
| 10,147,620 B2* | 12/2018 | Benjaminson | H01J 37/32082 |
| 10,607,867 B2* | 3/2020 | Benjaminson | H01L 21/324 |
| 2003/0015515 A1* | 1/2003 | Ito | H01L 21/6833 219/444.1 |
| 2004/0187787 A1* | 9/2004 | Dawson | H01L 21/6833 118/728 |
| 2008/0017104 A1* | 1/2008 | Matyushkin | H05B 3/0047 118/696 |
| 2009/0014323 A1 | 1/2009 | Yendler et al. | |
| 2012/0148369 A1* | 6/2012 | Michalski | F16B 43/001 411/371.1 |
| 2013/0065403 A1 | 3/2013 | Paranjpe et al. | |
| 2013/0279066 A1 | 10/2013 | Lubomirsky et al. | |
| 2013/0284373 A1 | 10/2013 | Sun et al. | |
| 2013/0343829 A1* | 12/2013 | Benedetti | F16B 39/284 411/3 |
| 2014/0008880 A1 | 1/2014 | Miura et al. | |
| 2014/0209245 A1* | 7/2014 | Yamamoto | H01L 21/67109 156/345.53 |
| 2015/0187625 A1 | 7/2015 | Busche et al. | |
| 2015/0235809 A1* | 8/2015 | Ito | H01J 37/32165 156/345.48 |

FOREIGN PATENT DOCUMENTS

| | | |
|---|---|---|
| JP | 2006-287213 A | 10/2006 |
| JP | 2007-300057 A | 11/2007 |
| JP | 2009-535801 A | 10/2009 |
| JP | 2014-072355 A | 4/2014 |
| TW | 201438139 A | 10/2014 |

OTHER PUBLICATIONS

International Preliminary Report on Patentability dated Feb. 6, 2018 in International Patent Application No. PCT/US2016/045543, 11 pages.

* cited by examiner

FIG. 6B    FIG. 6C

BOLTED WAFER CHUCK THERMAL MANAGEMENT SYSTEMS AND METHODS FOR WAFER PROCESSING SYSTEMS

CROSS-REFERENCE TO RELATED APPLICATIONS

This application is a continuation of U.S. patent application Ser. No. 16/209,581, filed Dec. 4, 2018, which is a continuation of U.S. patent application Ser. No. 15/581,545, filed Apr. 28, 2017, now U.S. Pat. No. 10,147,620 which is a continuation of U.S. patent application Ser. No. 14/820,422, filed Aug. 6, 2015, now U.S. Pat. No. 9,691,645. The present disclosure is also related to the subject matter of commonly-owned U.S. patent application Ser. No. 14/820,365, filed Aug. 6, 2015. All of these documents are hereby incorporated by reference in their entirety for all purposes.

TECHNICAL FIELD

The present disclosure applies broadly to the field of processing equipment. More specifically, systems and methods for providing spatially tailored processing on a workpiece are disclosed.

BACKGROUND

Integrated circuits and other semiconductor products are often fabricated on surfaces of substrates called "wafers." Sometimes processing is performed on groups of wafers held in a carrier, while other times processing and testing are performed on one wafer at a time. When single wafer processing or testing is performed, the wafer may be positioned on a wafer chuck. Other workpieces may also be processed on similar chucks. Chucks can be temperature controlled in order to control temperature of a workpiece for processing.

SUMMARY

In an embodiment, a workpiece holder positions a workpiece for processing. The workpiece holder includes a substantially cylindrical puck, a first heating device disposed in thermal communication with a radially inner portion of the puck, a second heating device disposed in thermal communication with a radially outer portion of the puck, and a thermal sink disposed in thermal communication with the puck. The first and second heating devices are independently controllable with respect to one another, and the first and second heating devices are in greater respective degrees of thermal communication with the puck, than a degree of thermal communication of the thermal sink with the puck.

In an embodiment, a method of controlling spatial temperature distribution of a workpiece includes providing a reference temperature to a substantially cylindrical puck by flowing a heat exchange fluid at a controlled temperature through channels in a thermal sink that is in thermal communication with the puck, raising a temperature of a radially inner portion of the puck to a first temperature that is greater than the reference temperature, by activating a first heating device disposed in thermal communication with the radially inner portion of the puck, raising a temperature of a radially outer portion of the puck to a second temperature that is greater than the reference temperature, by activating a second heating device disposed in thermal communication with the radially outer portion of the puck, and placing the workpiece on the puck.

In an embodiment, a workpiece holder that positions a workpiece for processing includes a substantially cylindrical puck that is characterized by a cylindrical axis and a substantially planar top surface. The puck defines two radial thermal breaks. The first one thermal break is characterized as a radial recess that intersects a bottom surface of the puck at a first radius, and extends from the bottom surface through at least one-half of a thickness of the puck. The second thermal break is characterized as a radial recess that intersects the top surface of the puck at a second radius that is greater than the first radius, and extends from the top surface through at least one-half of the thickness of the puck. The first and second thermal breaks define a demarcation between a radially inner portion of the puck and a radially outer portion of the puck. The puck includes a first heating device embedded within the radially inner portion of the puck, and a second heating device embedded within the radially outer portion of the puck. The workpiece holder also includes a thermal sink that extends substantially beneath the bottom surface of the puck, the thermal sink including a metal plate that flows a heat exchange fluid through channels defined therein, to maintain a reference temperature for the puck. The thermal sink mechanically and thermally couples with the puck at attachment points that provide a degree of thermal communication between the thermal sink and the puck that is less than a degree of thermal communication between each of the first and second heating devices and the puck.

BRIEF DESCRIPTION OF THE DRAWINGS

FIG. 6B schematically illustrates an embodiment of a wave washer in an uncompressed state, in accord with an embodiment.

FIG. 6C provides an upwardly looking, bottom plan view of the puck and optional thermal sink illustrated in FIG. 6A.

DETAILED DESCRIPTION

Figure 1:
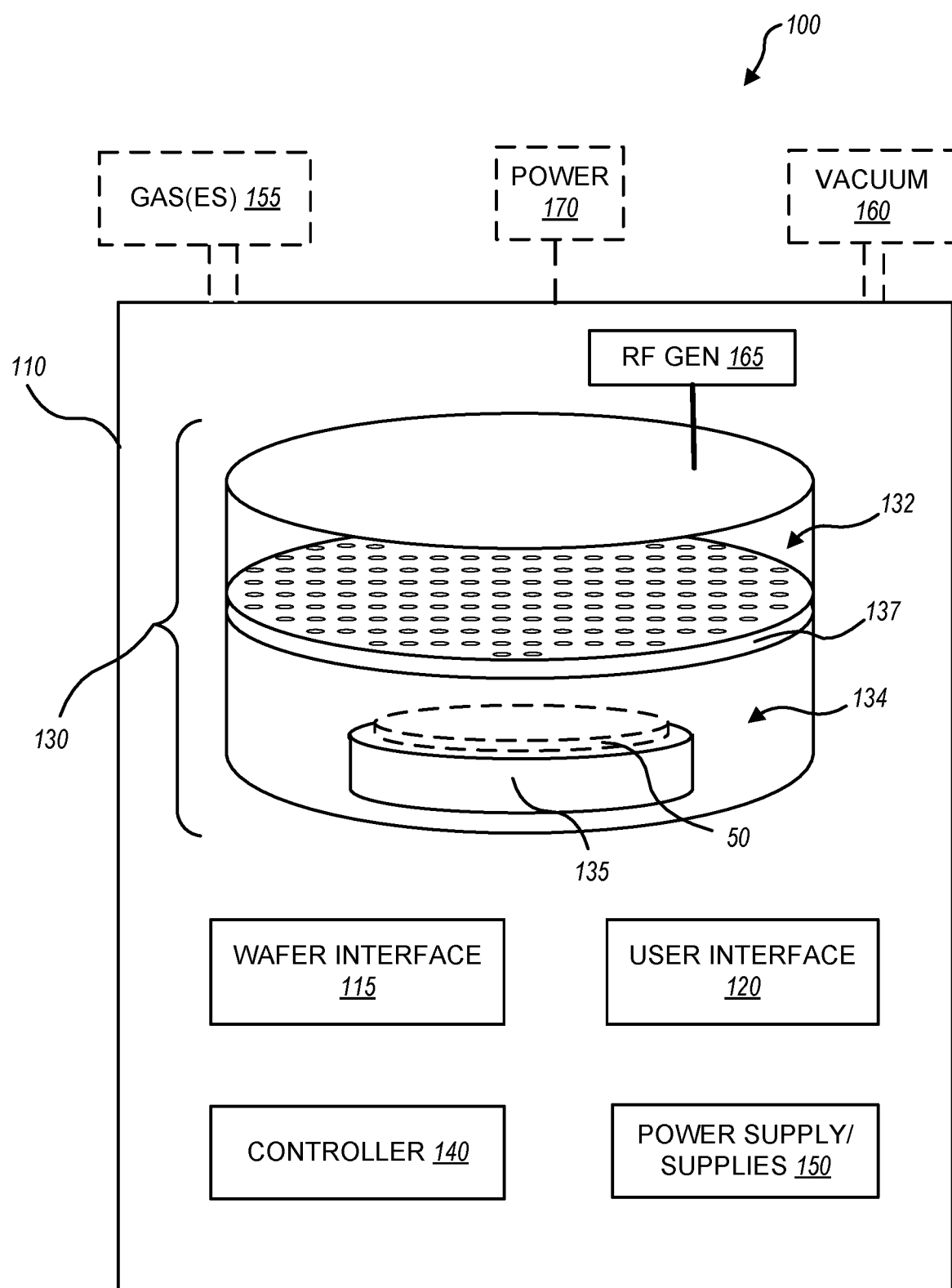
FIG. 1 schematically illustrates major elements of a processing system having a workpiece holder, according to an embodiment.

The present disclosure may be understood by reference to the following detailed description taken in conjunction with the drawings described below, wherein like reference numerals are used throughout the several drawings to refer to similar components. It is noted that, for purposes of illustrative clarity, certain elements in the drawings may not be drawn to scale. Specific instances of an item may be referred to by use of a numeral following a dash (e.g., heaters 220-1, 220-2) while numerals without parentheses refer to any such item (e.g., heaters 220). In instances where multiple instances of an item are shown, only some of the instances may be labeled, for clarity of illustration.

FIG. 1 schematically illustrates major elements of a wafer processing system 100. System 100 is depicted as a single wafer, semiconductor wafer plasma processing system, but it will be apparent to one skilled in the art that the techniques and principles herein are applicable to wafer processing systems of any type (e.g., systems that do not necessarily process wafers or semiconductors, and do not necessarily utilize plasmas for the processing). Processing system 100 includes a housing 110 for a wafer interface 115, a user interface 120, a plasma processing unit 130, a controller 140 and one or more power supplies 150. Processing system 100 is supported by various utilities that may include gas(es) 155, external power 170, vacuum 160 and optionally others. Internal plumbing and electrical connections within processing system 100 are not shown, for clarity of illustration.

Processing system 100 is shown as a so-called indirect plasma processing system that generates a plasma in a first location and directs the plasma and/or plasma products (e.g., ions, molecular fragments, energized species and the like) to a second location where processing occurs. Thus, in FIG. 1, plasma processing unit 130 includes a plasma source 132 that supplies plasma and/or plasma products for a process chamber 134. Process chamber 134 includes one or more workpiece holders 135, upon which wafer interface 115 places a workpiece 50 (e.g., a semiconductor wafer, but could be a different type of workpiece) to be held for processing. When workpiece 50 is a semiconductor wafer, workpiece holder 135 is often referred to as a wafer chuck. In operation, gas(es) 155 are introduced into plasma source 132 and a radio frequency generator (RF Gen) 165 supplies power to ignite a plasma within plasma source 132. Plasma and/or plasma products pass from plasma source 132 through a diffuser plate 137 to process chamber 134, where workpiece 50 is processed. Alternatively or in addition to plasma from plasma source 132, a plasma may also be ignited within process chamber 134 for direct plasma processing of workpiece 50.

Embodiments herein provide new and useful functionality for plasma processing systems. Semiconductor wafer sizes have increased while feature sizes have decreased significantly over the years, so that more integrated circuits with greater functionality can be harvested per wafer processed. Processing smaller features while wafers grow larger requires significant improvements in processing uniformity. Because chemical reaction rates are often temperature sensitive, temperature control across wafers during processing is often key to uniform processing.

Also, some types of processing can have radial effects (e.g., processing that varies from center to edge of a wafer). Some types of process equipment control these effects better than others, that is, some achieve high radial process uniformity while others do not. Embodiments herein recognize that radial effects are advantageously controlled, and it would be further advantageous to be able to provide radial processing that can be tailored to compensate for processing that cannot achieve such control. For example, consider a case in which a layer is deposited on a wafer and then selectively etched off, as is common in semiconductor processing. If the deposition step is known to deposit a thicker layer at the wafer's edge than at its center, a compensating etch step would advantageously provide a higher etch rate at the wafer's edge than at its center, so that the deposited layer would be etched to completion at all parts of the wafer at the same time. Similarly, if an etch process were known to have a center-to-edge variation, a compensating deposition preceding the etch process could be adjusted to provide a corresponding variation.

In many such cases of processing with radial effects, a compensating process can be provided by providing explicit center-to-edge temperature variation, because temperature often substantially influences reaction rates of processes.

Figure 2:
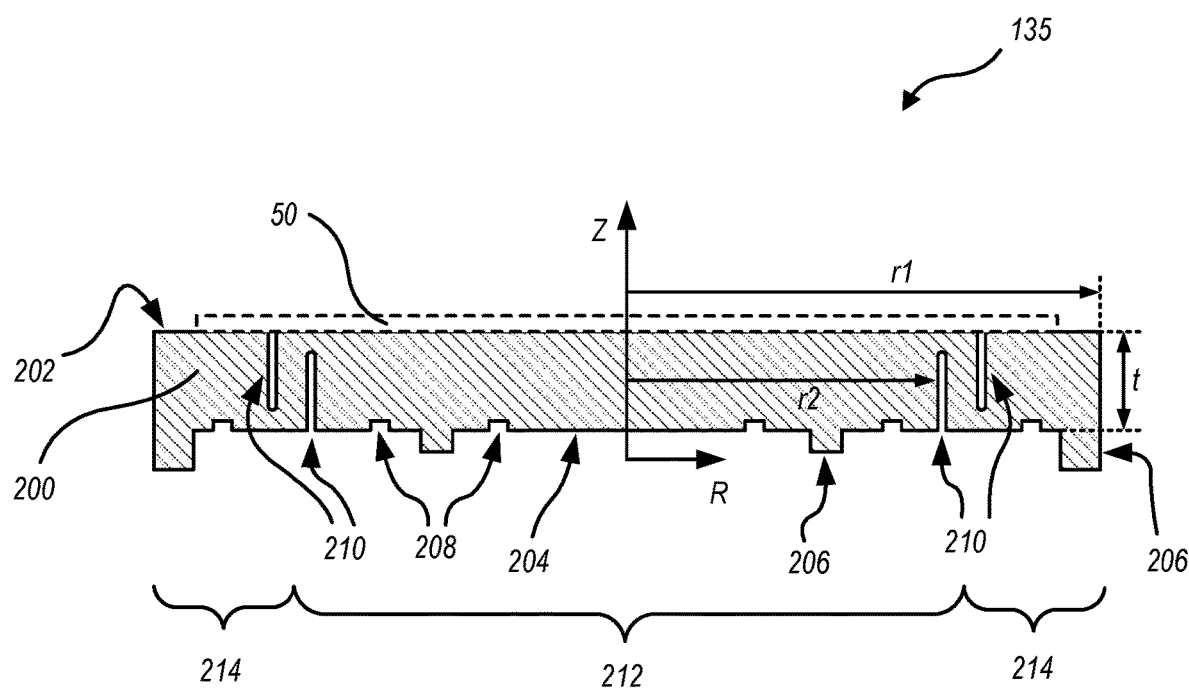
FIG. 2 is a schematic cross sectional diagram illustrating exemplary construction details of a workpiece holder of FIG. 1.

FIG. 2 is a schematic cross section that illustrates exemplary construction details of workpiece holder 135, FIG. 1. As shown in FIG. 2, workpiece holder 135 includes a puck 200 that is substantially cylindrical, and is characterized in terms of having a puck radius r1 in a radial direction R from a cylindrical axis Z. In use, a workpiece 50 (e.g., a wafer) may be placed on puck 200 for processing. A bottom surface 204 of puck 200 is taken to be a median bottom surface height of puck 200; that is, a plane that defines the typical bottom surface height of puck 200 in the direction of axis Z exclusive of features such as edge rings or other protrusions 206, or indentations 208, that puck 200 may form as attachment points for other hardware. Similarly, a top surface 202 is taken to be a planar surface configured to accommodate workpiece 50, irrespective of grooves that may be formed therein (e.g., as vacuum channels, see FIG. 4) and/or other features that retain workpiece 50. All such protrusions, indentations, grooves, rings and the like do not, in the context of this specification, detract from the characterization of puck 200 as "substantially cylindrical." Puck 200 may also be characterized in terms of having a thickness t between bottom surface 204 and top surface 202, as shown. In certain embodiments, puck radius r1 is at least four times puck thickness t, but this is not a requirement.

Puck 200 defines one or more radial thermal breaks 210, as shown. Thermal breaks 210 are radial recesses defined in puck 200, that intersect at least one of top surface 202 or bottom surface 204 of puck 200. Thermal breaks 210 act as the term implies, that is, they provide thermal resistance, between a radially inner portion 212, and a radially outer portion 214, of puck 200. This facilitates explicit radial (e.g., center-to-edge) thermal control of the radially inner and outer portions of puck 200, which is advantageous in terms of either providing precise thermal matching of the inner and outer portions, or of providing deliberate temperature variation across the inner and outer portions. Thermal breaks 210 can be characterized in terms of having a thermal break depth and a thermal break radius. Depth of thermal breaks 210 can vary among embodiments, but the thermal break depth usually exceeds one-half of thickness t. Radial positioning of thermal breaks 210 can also vary among embodiments, but the thermal break radius r2 is usually at least one-half of puck radius r1, and in other embodiments r2 may be three-fourths, four-fifths, five sixths or more of puck radius r1. Certain embodiments may use a single thermal break 210, while other embodiments may use two thermal breaks 210 (as shown in FIG. 2) or more. A demarcation point between radially inner portion 212 and radially outer portion 214 is illustrated as a radially average position between two thermal breaks 210, but in embodiments having a single thermal break 210, such demarcation point can be considered to be the radial midpoint of the single thermal break 210.

Figure 3:
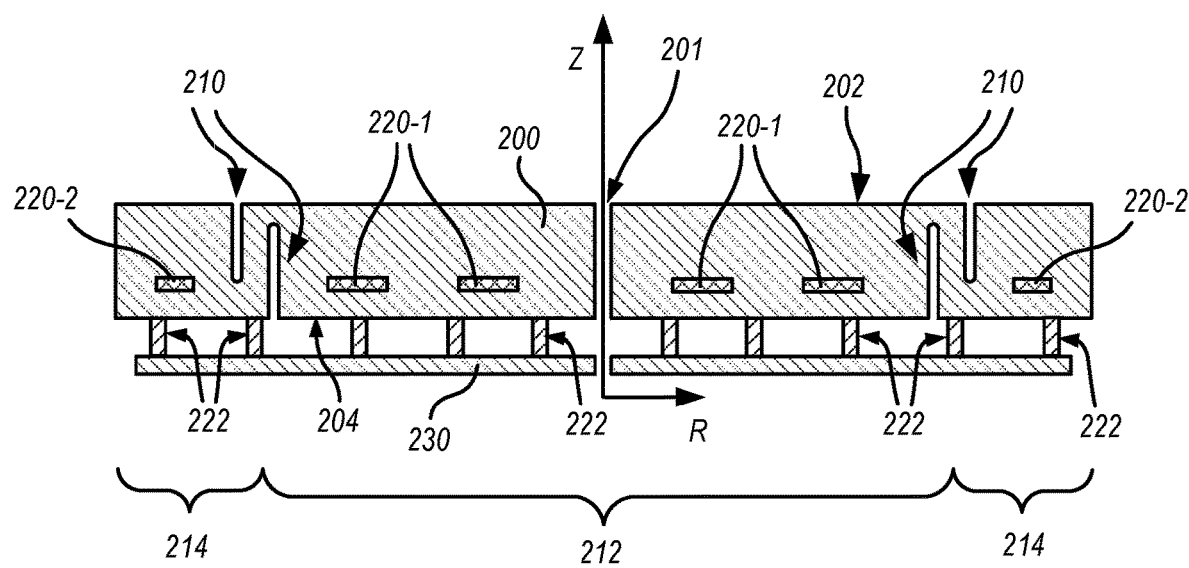
FIG. 3 is a schematic cross sectional diagram illustrating integration of heaters and a thermal sink with inner and outer portions of a puck that forms part of the workpiece holder of FIG. 1, in accord with an embodiment.

One way in which thermal breaks, as illustrated in FIG. 2, can be used advantageously is to provide radially applied heating and/or cooling to inner portion 212 and outer portion 214 of puck 200. FIG. 3 is a schematic cross sectional diagram illustrating integration of heaters and a thermal sink with inner and outer portions of puck 200. Some mechanical details of puck 200 are not shown in FIG. 3, for clarity of illustration. FIG. 3 illustrates a central channel 201 defined by puck 200 and an optional thermal sink 230. Central channel 201 is described in connection with FIG. 4. Inner heaters 220-1 and outer heaters 220-2 are disposed in thermal communication with puck 200; heaters 220 are shown as embedded within puck 200, although this is not required. It may be advantageous for heaters 220 to be placed across large portions of puck 200, but the distribution of heaters 220 across surface 204 can vary in embodiments. Heat provided by heaters 220 will substantially control the temperatures of inner portion 212 and outer portion 214 of puck 200; thermal breaks 210 assist in thermally isolating portions 212 and 214 from one another, to improve the precision of thermal control thereof. Heaters 220 are typically resistive heaters, but other types of heaters (e.g., utilizing forced gas or liquid) may be used.

Optional thermal sink 230 may also be provided. Thermal sink 230 may be controlled to present a lower temperature than typical operating temperatures, for example by flowing a heat exchange fluid at a controlled temperature therethrough, or by using a cooling device such as a Peltier cooler. When present, thermal sink 230 provides several advantages. One such advantage is to provide a reference temperature toward which all portions of puck 200 will have, in the absence of heat provided by heaters 220. That is, although heaters 220 can provide heat, such heat would ordinarily propagate, in all directions, throughout puck 200. Thermal sink 230 provides the ability to drive all portions of puck 200 to lower temperatures, such that if a heater 220 is located at a specific portion of puck 200, the heat generated by the heater does not simply diffuse throughout puck 200 in every direction, but heats a portion of puck 200 where the heat from the heater 200 locally exceeds the tendency of thermal sink 230 to remove the heat. When present, thermal sink 230 may be thermally and/or mechanically coupled with puck 200 at a plurality of attachment points 222 (shown schematically in FIG. 3, although attachment points 222 may not resemble what is shown in FIG. 3; see FIGS. 6A, 6B and 6C). Attachment points 222 are advantageously numerous and spread evenly about surface 204 of puck 200. Attachment points 222 provide substantially all of the thermal communication of puck 200 with thermal sink 230, the numerous and evenly spread arrangement of attachment points 222 is provided so that the reference temperature provided is uniformly applied. For example, a puck 200 that is at least ten inches in diameter might have at least twenty attachment points or more, and a puck 200 that is at least twelve inches in diameter might have at least thirty attachment points, or many more.

A related advantage is that thermal sink 230 can provide rapid thermal sinking capability such that when temperature settings of heaters 220 (e.g., electrical currents passing through resistive wires) decrease, adjacent portions of puck 200 respond with a relatively rapid temperature decrease. This provides the benefit of being able, for example, to load workpiece 50 onto puck 200, provide heat through heaters 220, and achieve rapid stabilization of temperatures on workpiece 50 so that processing can begin quickly, to maximize system throughput. Without thermal communication allowing some heat to dissipate to thermal sink 230, temperatures reached by portions of puck 200 would decrease only as fast as other heat dissipation paths would allow.

Heaters 220 and thermal sink 230 are typically disposed in differing degrees of thermal communication with puck 200; for example heaters 220 may be said to be in direct thermal communication with puck 200, while thermal sink is in indirect thermal communication with puck 200. That is, heaters 220 are typically positioned for a high degree of thermal coupling with puck 200, with thermal sink 230 being positioned for a lesser degree of thermal coupling with puck 200 (at least, a lesser degree of thermal coupling with puck 200 than heaters 220). Also, heaters 220 have sufficient heat generation capability that heat applied by heaters 220 can overwhelm the thermal coupling of puck 200 with thermal sink 230, so that heaters 220 can raise the temperature of inner portion 212 and outer portion 214 of puck 200, even while some of the heat generated by heaters 200 dissipates through thermal sink 230. Thus, heat provided by heaters 220 can, but does not immediately, dissipate through thermal sink 230. In embodiments, placement and degrees of thermal coupling among puck 200, heaters 220 and thermal sink 230 may be adjusted according to principles herein, in order to balance considerations such as temperature uniformity within each of inner portion 212 and outer portion 214, rapidity of thermal stabilization, manufacturing complexity and cost, and overall energy consumption.

Yet another advantage of thermal sink 230 is to confine heat generated by heaters 220 to the vicinity of puck 200. That is, thermal sink 230 can provide a thermal upper limit for adjacent system components to protect such components from high temperatures generated at puck 200. This may improve mechanical stability of the system and/or prevent damage to temperature sensitive components.

Heaters 220 and thermal sink 230 may be implemented in various ways. In an embodiment, heaters 220 are provided by cable type heating elements that are integrated with a puck 200 and then (optionally) with thermal sink 230 to form a wafer chuck assembly. Embodiments designed, assembled and operated as disclosed herein allow explicit temperature control of workpiece (e.g., wafer) edge regions relative to center regions, and facilitate processing with explicit center to edge temperature control that is typically not achievable with prior art systems.

Figure 4:
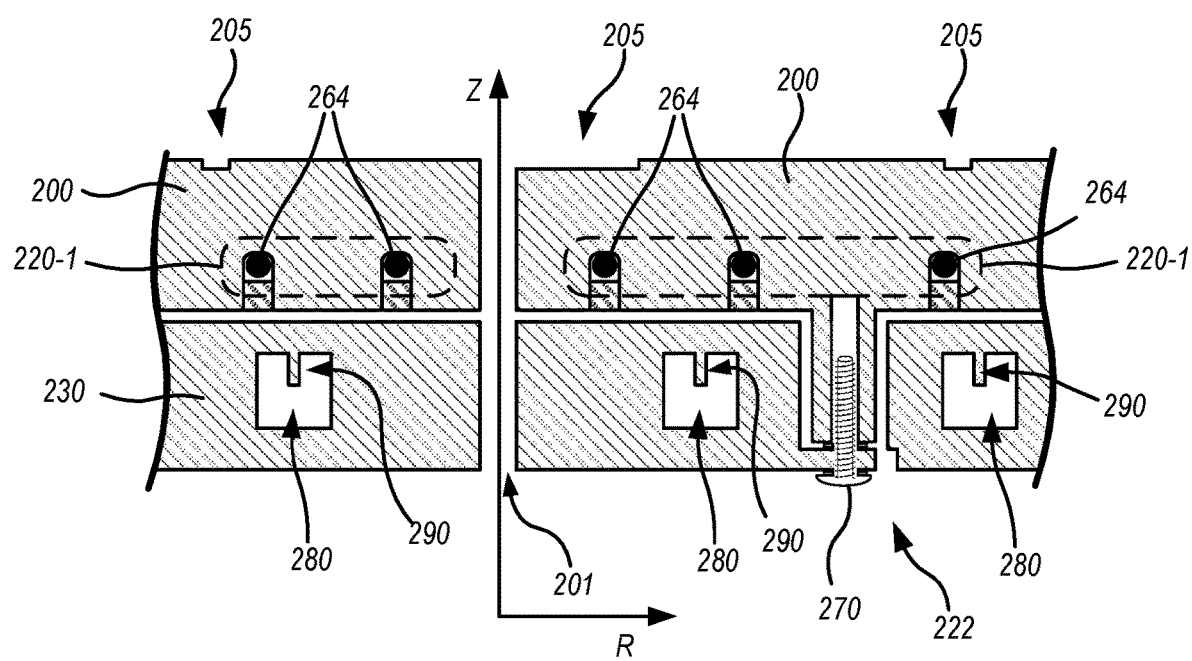
FIG. 4 is a schematic cross-sectional view that illustrates a portion of a wafer chuck, that illustrates features of a puck, a resistive heater, and a thermal sink, in accord with an embodiment.

FIG. 4 is a schematic cross-sectional view that illustrates a portion of a wafer chuck, that illustrates features of puck 200, a resistive heater acting as heater 220-1, and thermal sink 230. FIG. 4 represents a portion of the wafer chuck that is near a cylindrical axis Z thereof, and is not drawn to scale, for illustrative clarity of smaller features. Puck 200 is typically formed of an aluminum alloy, for example of the well-known "6061" alloy type. Puck 200 is shown as defining surface grooves or channels 205 that connect on upper surface 202 of puck 200, and with central channel 201 that is centered about axis Z. Vacuum may be supplied to central channel 201, reducing pressure within channels 205 so that atmospheric pressure (or gas pressure of relatively high pressure plasmas, or low pressure deposition systems, such as around 10-20 Torr) will urge workpiece 50 (see FIGS. 1, 2) against puck 200, providing good thermal communication between puck 200 and workpiece 50.

Inner resistive heater 220-1 is illustrated in FIG. 4, but it should be understood that the illustration and following description of inner resistive heater 220-1 apply equally to outer resistive heater 220-2. Resistive heater 220-1 includes a cable heater 264 that winds in a spiral or other pattern within puck 200. Cable heater 264 is assembled into puck 200 by placing it within grooves in puck 200 and capping the grooves (see FIG. 5). After assembly of cable heater 264 as inner resistive heater 200-1 (and a second cable heater as outer resistive heater 200-2) puck 200 is assembled to thermal sink 230 by means of fasteners 270. Areas of both puck 200 and thermal sink 230 that provide attachment points for fasteners 270 are arranged to manage heat transfer characteristics between puck 200 and thermal sink 230 around fasteners 270, as discussed in more detail further below (see FIGS. 6A, 6B, 6C).

Figure 5:
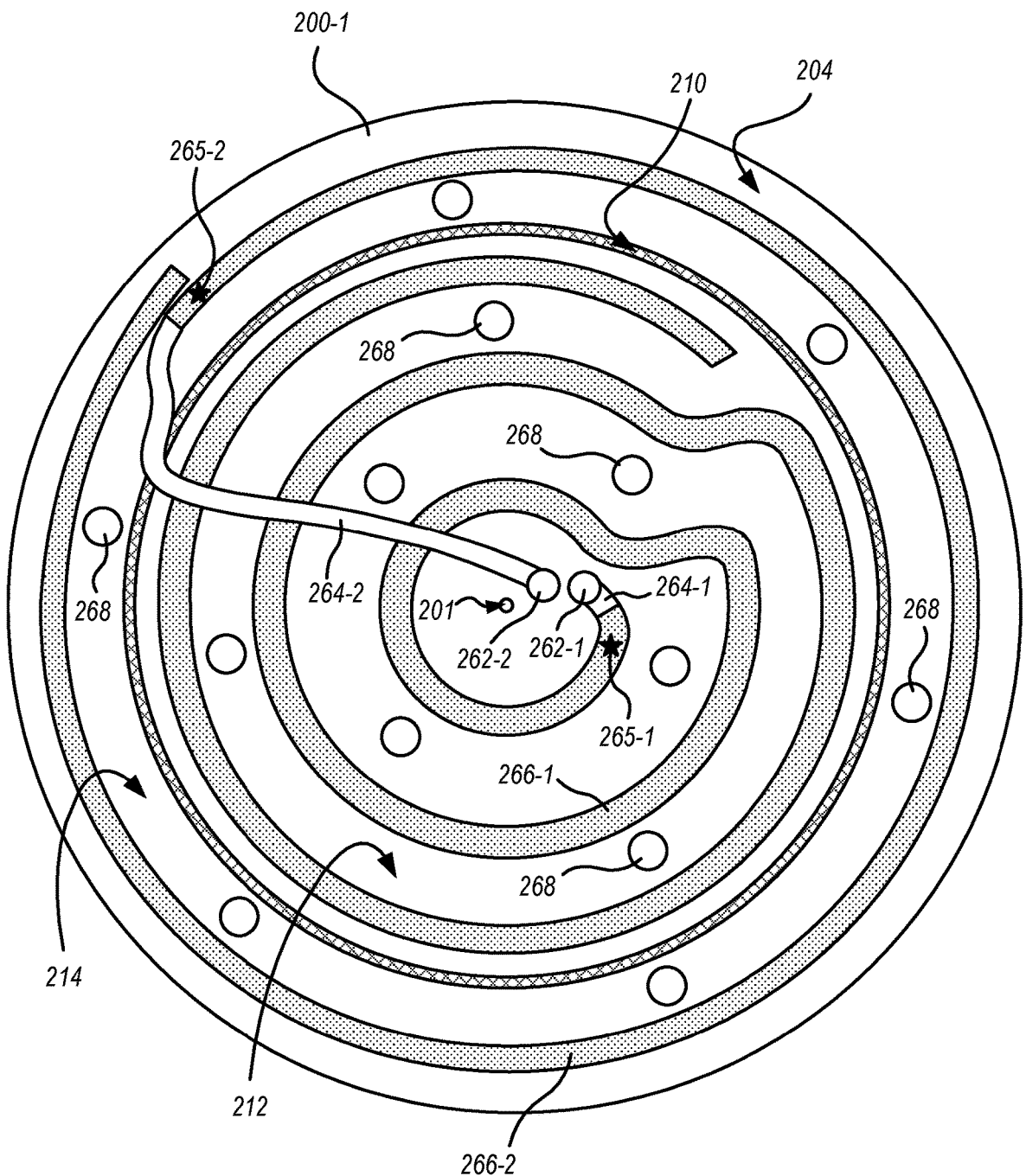
FIG. 5 schematically illustrates an underside of a puck having cable heaters installed therein as inner and outer resistive heaters, in accord with an embodiment.

FIG. 5 schematically illustrates an underside of a puck 200-1 having cable heaters 264-1 and 264-2 installed therein as inner and outer resistive heaters respectively. A thermal break 210 is a recess defined in bottom surface 204 of puck 200-1 and forms a radial demarcation between inner portion 212 and outer portion 214 of puck 200 (see FIGS. 2, 3). Cable heater 264-1 extends from a connector 262-1 along a roughly spiral path that is laid out for uniform heat transfer to all areas of inner portion 212. A heater cap 266-1 is illustrated as a shaded portion of the spiral path; heater cap 266-1 is coupled in place after cable heater 264-1 is put into place. In an embodiment, heater cap 266-1 is a fillet that is pre-formed into a shape of the groove in which cable heater 264-1 is installed, and is secured into place. Heater cap 266-1 may for example be welded into place using electron beam welding, but could also be secured with adhesives or fillers (e.g., epoxy). The fillet is preferably welded into place along at least part of an arc length of the cable heater, but need not be welded along its entire arc length (e.g., portions may not be welded in order to avoid damage to overlying structures, such as cable heater 264-2). In an embodiment, heater cap 266-1 is welded into place using electron beam welding. A cold-to-hot transition point 265-1 indicates where conductive wires in cable heater 264-1, extending from connector 262-1 and hidden underneath heater cap 266-1, connect with resistive materials within cable heater 264-1. Thus, little heat is generated between connector 262-1 and transition point 265-1, but a uniform amount of heat per unit length is generated in cable heater 264-1 past transition point 265-1. Cable heater 264-2 extends from a connector 262-2, first radially outwards from a central region of puck 200 (where connections are made through a shaft of the wafer chuck), then along a roughly circular path that is laid out for uniform heat transfer to outer portion 214. A heater cap 266-2 is illustrated as a shaded portion of the spiral path; heater cap 266-2 is coupled in place after cable heater 264-2 is put into place. In an embodiment, heater cap 266-2 is a fillet that is pre-formed into a shape of the groove in which cable heater 264-2 is installed, and is welded into place using electron beam welding. Like heater cap 266-1, the fillet forming heater cap 266-2 is preferably welded into place along at least part of its arc length, but need not be welded along its entire arc length. A cold-to-hot transition point 265-2 indicates where conductive wires in cable heater 264-2, extending from connector 262-2 and hidden underneath heater cap 266-2, connect with resistive materials within cable heater 264-2. Thus, little heat is generated between connector 262-2 and transition point 265-2, but a uniform amount of heat per unit length is generated in cable heater 264-2 past transition point 265-2. A set of protrusions 268 are also illustrated in FIG. 5. Protrusions 268 are protrusions from bottom surface 204 out of the plane of the drawing (e.g., such that they will face thermal sink 230, see FIG. 3). Protrusions 268 form locations for attachment points 222, cooperate with fasteners 270, FIG. 4, and are discussed in further detail below in connection with FIGS. 6A, 6B.

Figure 6A:
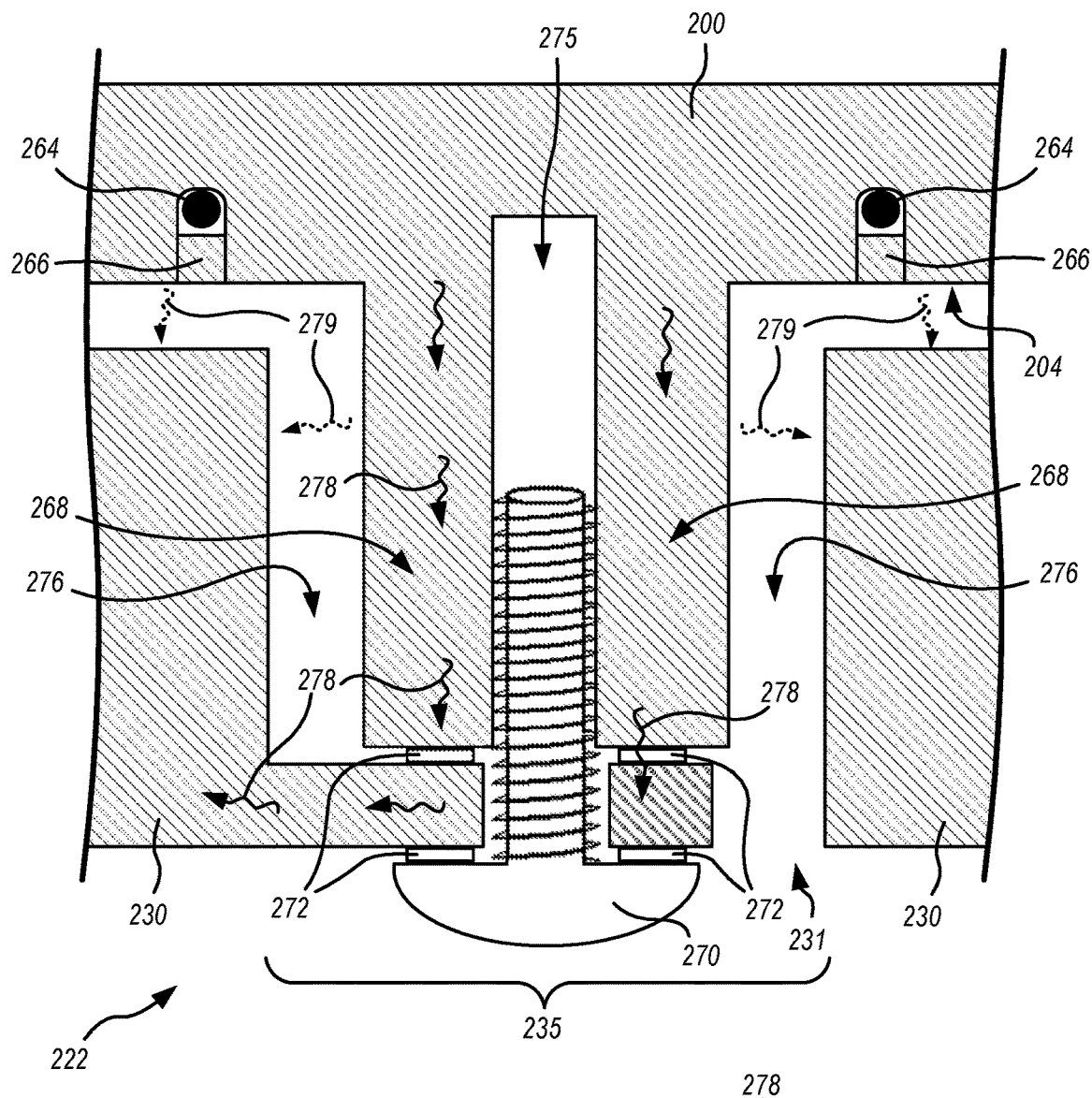
FIG. 6A is a detailed view of a portion of the puck and optional thermal sink of FIG. 4, in the vicinity of a fastener.

FIG. 6A is a detailed view of a portion of puck 200 and optional thermal sink 230 as shown in FIG. 4, in the vicinity of fastener 270. Puck 200 includes cable heater 264 sealed into puck 200 with heater cap 266, as discussed above in connection with FIG. 5. As noted further above, optional thermal sink 230 can provide a reference temperature for puck 200, yet it is desirable that thermal sink 230 and puck 200 be arranged for a lesser degree of thermal communication than between puck 200 and heaters 220. Therefore, attachment points that allow thermal communication between thermal sink 230 and puck 200 are advantageously arranged to manage thermal transfer characteristics therebetween. For example, puck 200 and thermal sink 230 may be fabricated such that a lateral gap 276 exists between protrusion 268 and thermal sink 230, as shown. That is, a thickness of thermal sink 230 is reduced in a thinned region 235, in the vicinity of protrusion 268, and a lateral extent of thinned region 235 is greater than a lateral extent of protrusion 268, forming lateral gap 276 between protrusion 268 and a full thickness portion of thermal sink 230. Thermal sink 230 forms an aperture for fastener 270 to pass through, and protrusion 268 defines an internal void 275, a portion of which may be internally threaded for fastener 270 to couple thereto. However, void 275 may be longer than a length of fastener 270, for example as shown in FIG. 6A, to limit thermal transfer from puck 200 through protrusion 268. The physical point of attachment of puck 200 to thermal sink 230 includes protrusion 268, fastener 270, and a pair of washers 272. Major heat transfer paths in the vicinity of fastener 270 are shown in FIGS. 6A and 6B as solid, wavy arrows 278, while minor (e.g., radiative) heat transfer paths are shown as broken, wavy arrows 279. A void 231 is discussed below in connection with FIG. 6C.

FIG. 6B schematically illustrates an embodiment of a wave washer 272 in an uncompressed state. While it is possible to utilize flat washers in certain embodiments, wave washers are advantageous in other embodiments. The azimuthally wavy form of washer 272 is advantageous in that puck 200 can couple with thermal sink 230 at a plurality of points without overconstraining either puck 200 or thermal sink 230 relative to one other. That is, given that only three points form a plane in a mathematical sense, more than three attachment points between puck 200 and thermal sink 230 forms an overconstrained system that imposes very strict mechanical tolerances on the planarity of attachment points between thermal sink 230 and protrusions 268 of puck 200. Use of a wave washer 272 allows for looser planarity tolerances in such features because washer 272 will provide mechanical coupling throughout a range of compression, rather than requiring attachment points of the respective components to lie along a perfectly planar surface. Similarly, wave washer 272's range of compression allows for local thermal expansion effects in puck 200 and/or thermal sink 230. In certain embodiments, wave washer 272 has an uncompressed thickness 273 that is at least double a compressed thickness 274; in other embodiments wave washer 272 has an uncompressed thickness 273 that is at least five times compressed thickness 274. Although washer 272 is shown in flat cross-sectional profile in FIG. 6A for illustrative clarity, it will be appreciated upon reading and understanding the present disclosure that fastener 270 may not be tightened to the point of flattening wave washer 272 completely, such that some waviness will exist in many, if not all, instances of wave washer 272 as installed. Also, when used, wave washer 272 reduces thermal communication between protrusion 268 and thermal sink 230 by forcing heat to pass from protrusion 268 to a local peak where washer 272 contacts protrusion 268, then laterally within washer 272 to a local trough where washer 272 contacts thermal sink 230. Washers 272 may be formed, for example, of beryllium copper. Certain embodiments utilize two washers 272, one on either side of thermal sink 230, as shown, while other embodiments utilize only a single washer 272, typically between protrusion 268 and thermal sink 230.

FIG. 6C provides an upwardly looking, bottom plan view in the vicinity of fastener 270. In FIG. 6C, a broken line 6A-6A indicates the cross-sectional plane shown in FIG. 6A. Thermal sink 230 forms one or more voids 231 within thinned region 235 near fastener 270. Voids 231 further reduce thermal communication between puck 200 and thermal sink 230. The number and arrangement of voids 231 in thermal sink 230 that are shown in FIG. 6C are not required; it will be appreciated upon reading and understanding the present disclosure that voids 231 can be modified in size, number and arrangement to adjust thermal coupling characteristics between thermal sink 230 and puck 200. For example, thermal coupling between thermal sink 230 and puck 200 could be reduced further still be providing a second set of voids 231, radially outward from voids 231 as shown in FIG. 6C, and by staggering the arrangement of the additional set with respect to the voids 231 shown, in order to lengthen a thermal path between protrusion 268 and the body of thermal sink 230. Also, although FIG. 6C shows an outer edge of thinned region 235 as being coincident with outer edges of voids 231, this is not always necessarily the case. Certain embodiments may have voids 231 that are well within edges of thinned region 235, or that extend partially into thermal sink 230 outside of thinned region 235. Similarly, the number, placement and wall thicknesses of protrusions 268 can be modified to achieve higher or lower thermal conduction between puck 200 and thermal sink 230.

A further advantage of providing at least one thermal break 210 that intersects a top surface of puck 200 is that certain mechanical features may be disposed at least partially within the thermal break such that the mechanical features do not generate a thermal anomaly on the surface of puck 200. For example, a wafer chuck commonly provides lift pins that can be used to raise a wafer to a small distance off of the chuck to facilitate access by wafer handling tools (typically using a paddle or other device that, after the wafer is raised, is inserted between the wafer and the chuck). However, the lift pins typically retract into holes in the chuck, and such holes and lift pin structure can locally affect wafer temperature during processing. When a thermal break intersects a top surface of puck 200, a location already exists for such a mechanism to be placed without introducing a thermal anomaly.

Figure 7:
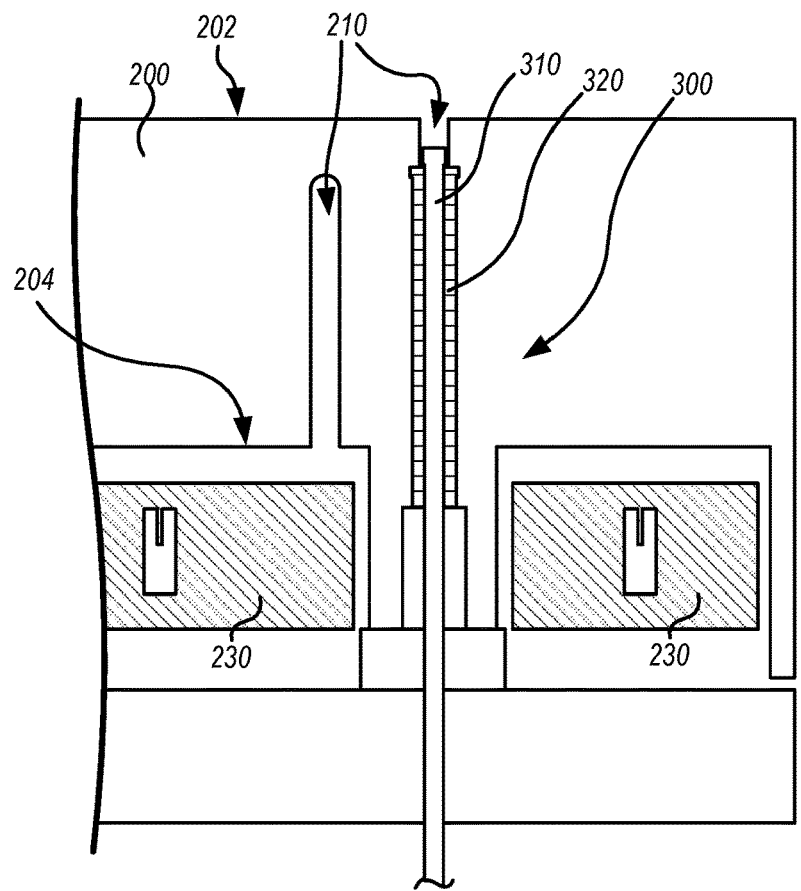
FIG. 7 schematically illustrates a lift pin mechanism disposed within a thermal break, in accord with an embodiment.

FIG. 7 schematically illustrates a portion of a wafer chuck that has a lift pin mechanism 300 that controls a lift pin 310, disposed within a thermal break 210. Portions of heaters 220 and optional thermal sink 230 are also shown. The cross-sectional plane illustrated in FIG. 7 passes through a center of mechanism 300 such that the components thereof are within a lower portion of one thermal break 210. In and out of the plane shown, puck 200, thermal break 210 and thermal sink 230 may have profiles like those shown in FIGS. 3 and 4, so that the thermal break 210 in which mechanism 300 is disposed will continue along its arc through puck 200 (see FIG. 8). Also, lift pin mechanism 300 is limited to a fairly small azimuthal angle relative to the central axis of puck 200 (again, see FIG. 8). That is, if a cross sectional plane were taken at a distance into or out of the plane shown in FIG. 7, the bottom surface of puck 200 would be continuous along the same plane where bottom surface 204 is indicated in FIG. 7, and thermal sink 230 would be continuous under puck 200. The small size of lift pin mechanism 300 limits thermal deviation of puck 200 in the area of lift pin mechanism 300. FIG. 7 shows lift pin 310 in a retracted position, wherein it will not create a thermal anomaly on the surface of puck 200.

Figure 8:
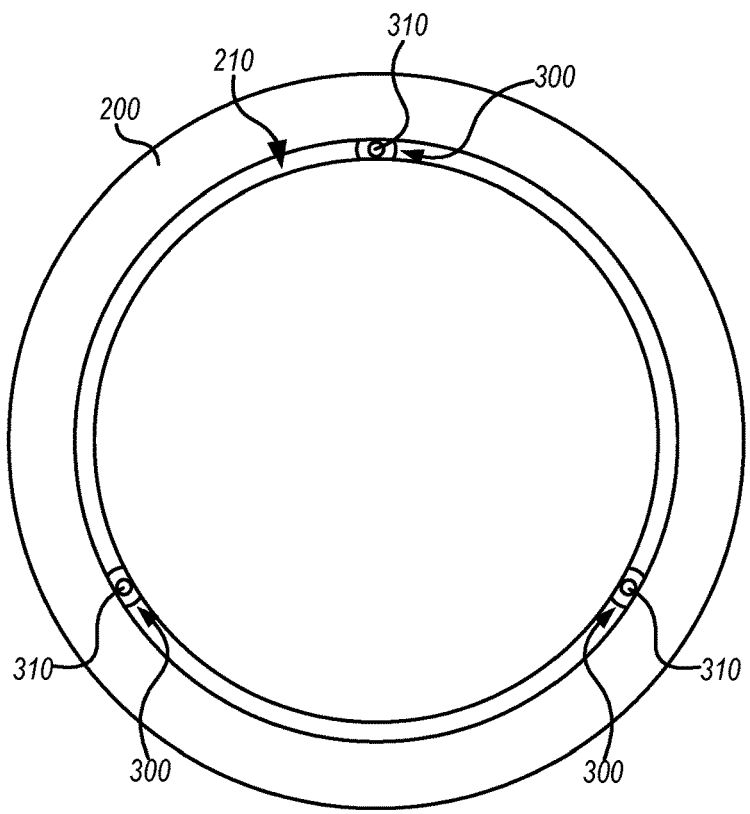
FIG. 8 schematically illustrates, in a plan view, a three lift pin arrangement where lift pins are disposed within a thermal break, in accord with an embodiment.

FIG. 8 schematically illustrates, in a plan view, a three lift pin arrangement where lift pins 310 are disposed within a thermal break 210. FIG. 8 is not drawn to scale, in particular, thermal break 210 is exaggerated so as to show lift pin mechanisms 300 and lift pins 310 clearly. Because lift pins 310 retract well below the average surface of puck 200 into thermal break 210, lift pins 310 do not generate a spatial thermal anomaly during processing, such that portions of a workpiece being processed at the locations of lift pins 310 (e.g., specific integrated circuits located at the corresponding locations of a semiconductor wafer) experience processing that is consistent with processing elsewhere on the workpiece.

Figure 9:
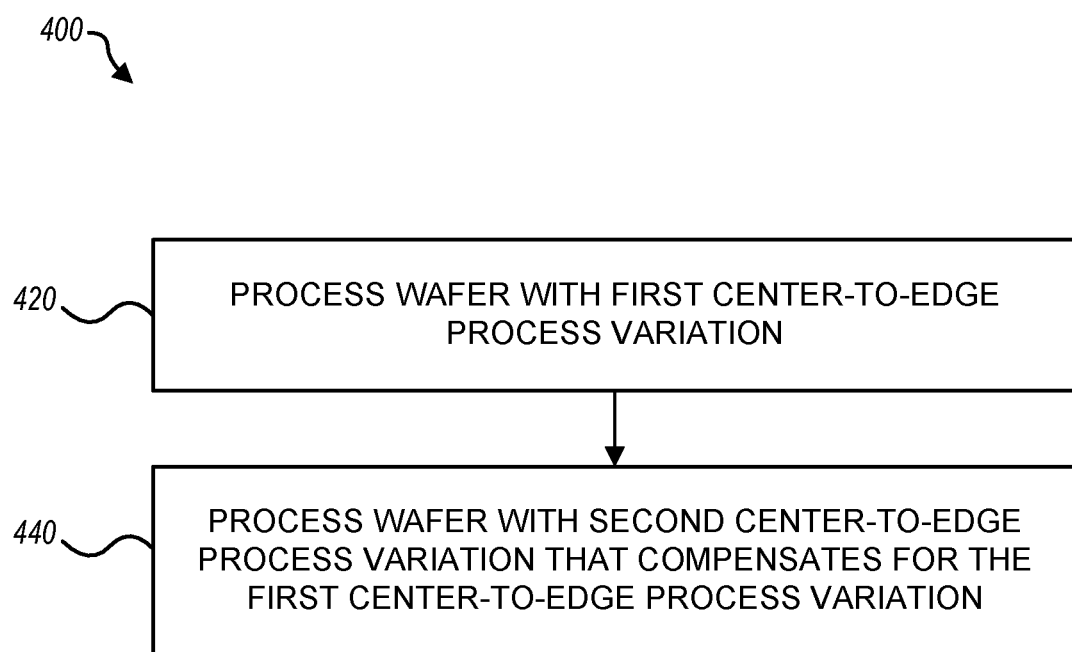
FIG. 9 is a flowchart of a method for processing a wafer or other workpiece, in accord with an embodiment.
Figure 10:
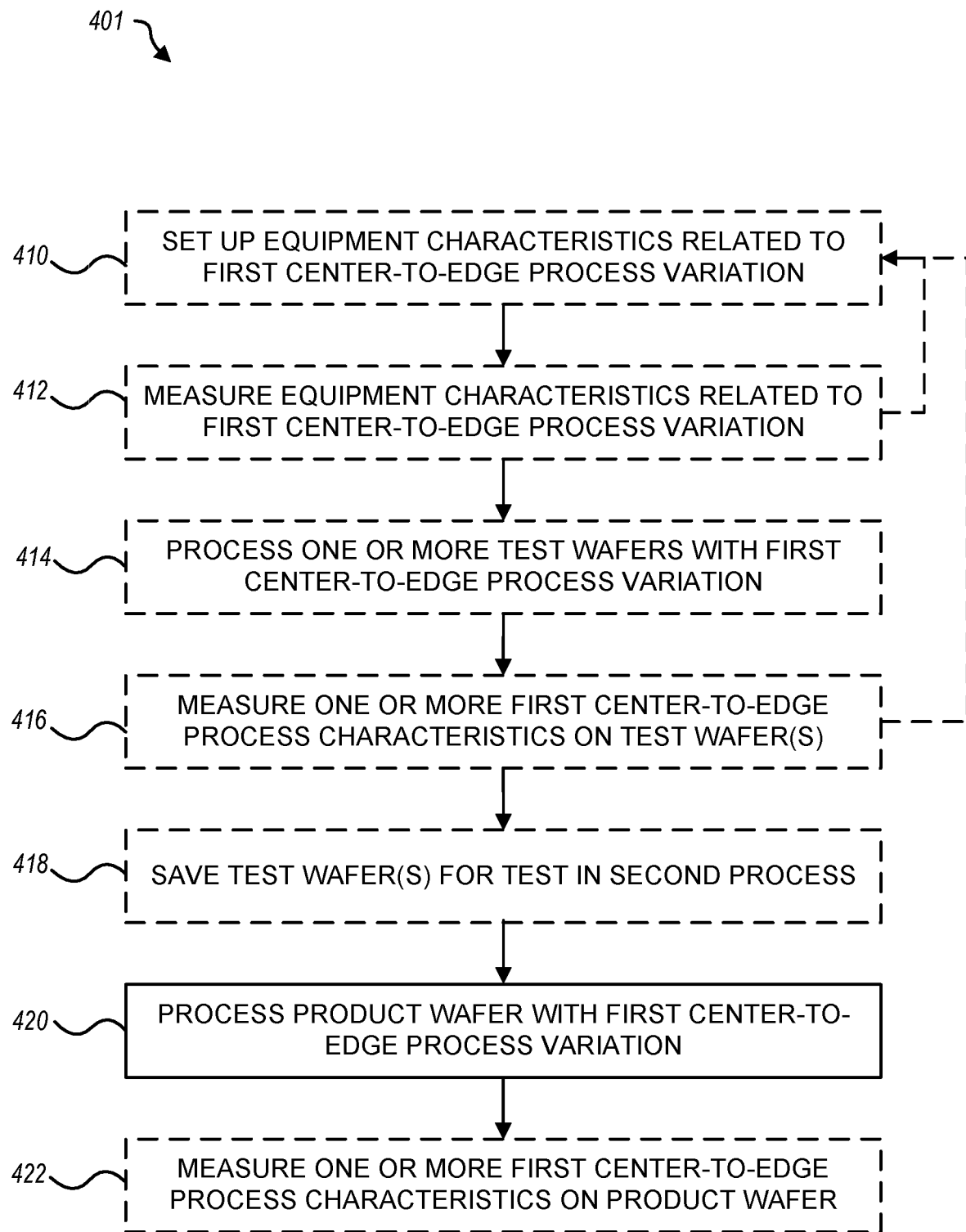
FIG. 10 is a flowchart of a method that includes, but is not limited to, one step of the method of FIG. 9.
Figure 11:
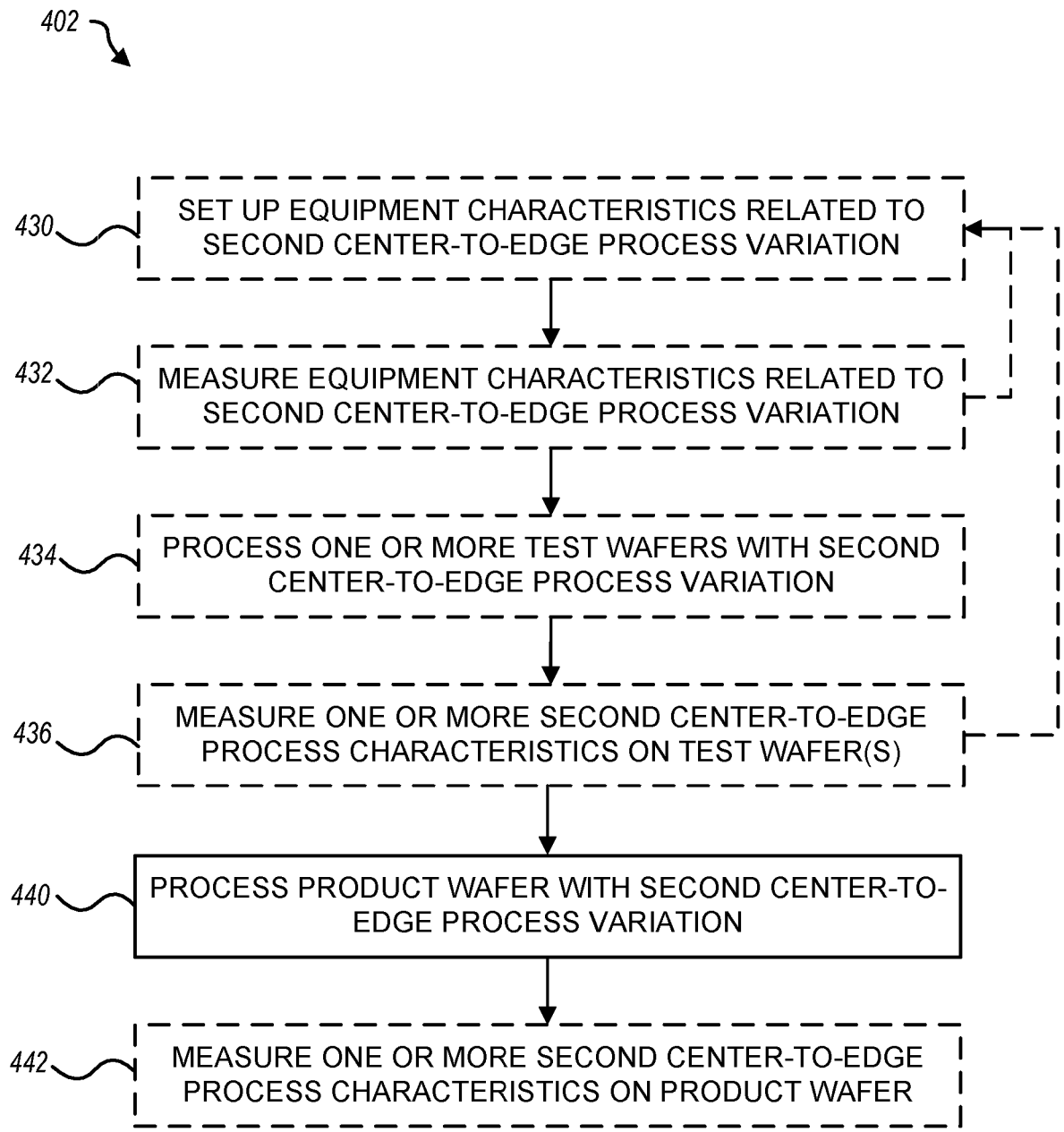
FIG. 11 is a flowchart of a method that includes, but is not limited to, another step of the method of FIG. 9.

FIG. 9 is a flowchart of a method 400 for processing a wafer or other workpiece (simply called a "product wafer" hereinafter for convenience, understanding that the concepts may apply to workpieces other than wafers). Method 400 may be uniquely enabled by the thermal management apparatus described in connection with FIGS. 2-8 that can be used to provide explicit center-to-edge thermal control, which in turn enables explicit center-to-edge process control. A first step 420 of method 400 processes the product wafer with a first center-to-edge process variation. A second step 440 of method 400 processes the product wafer with a second center-to-edge process variation that compensates for the first center-to-edge variation. Typically, one or the other of 420 or 440 will be carried out in equipment or in a process environment that unintentionally or uncontrollably generates the associated center-to-edge process variation (the "uncontrolled variation" hereinafter) but this is not required. Also, typically, the other is carried out in equipment such as that described herein, such that another center-to-edge process variation (the "controlled variation" hereinafter) is introduced through thermal management techniques that allow the center and edge portions of the product wafer to be explicitly controlled to provide a corresponding, inverse process variation. However, the uncontrolled variation and the controlled variation can occur in either order. That is, 420 may introduce either the uncontrolled or the controlled variation, and 440 may introduce the other of the uncontrolled and the controlled variation. FIGS. 10 and 11 provide additional guidance to those skilled in the art to enable useful exercise of method 400.

FIG. 10 is a flowchart of a method 401 that includes, but is not limited to, step 420 of method 400. All of 410-418 and 422 shown in FIG. 10 are considered optional, but in embodiments may be helpful, in execution of method 400 to achieve useful wafer processing results.

Step 410 sets up equipment characteristics that are related to the first center-to-edge process variation, which will be produced at 420. For example, when 420 is expected to introduce the controlled variation, 410 may involve providing equipment parameters such as heater settings that will provide a controlled center-to-edge temperature variation. Equipment such as described in FIGS. 2-8 herein is useful in providing a controlled center-to-edge temperature variation. Step 412 measures equipment characteristics that are related to the first center-to-edge process variation. Process knowledge may be acquired over time about what equipment settings, or measured equipment characteristics, are successful in generating a known center-to-edge process variation (or at least providing a process variation that is stable, albeit unintentional). In consideration of this process knowledge, method 401 may optionally return from 412 to 410 to adjust equipment characteristics, if the equipment characteristics measured in 412 can likely be improved. Step 414 processes one or more test wafers that receive the first center-to-edge process variation. Step 416 measures one or more characteristics of the first center-to-edge process variation on the test wafer(s) processed in step 414. Method 401 may optionally return from 416 to 410 to adjust equipment characteristics in light of the center-to-edge process characteristics measured in 416. Any test wafers processed in 414 may optionally be saved in 418, for testing in the second process (e.g., the process to be executed later, in 440). Also, 414 may be performed in parallel with 420. That is, when process equipment is appropriately configured, test wafers may be processed at the same time as product wafers (for example, if the first process is a so-called "batch" process like dipping a cassette of wafers into a liquid bath, processing a set of wafers together in an ampoule, diffusion furnace or deposition chamber, or the like).

Step 420 processes a product wafer with the first center-to-edge process variation. Step 422 measures one or more first center-to-edge characteristics on the product wafer, to generate data for equipment process control purposes, for correlation to yield or performance of the product wafer, and/or for use in correlating to information surrounding step 440, as described further below.

FIG. 11 is a flowchart of a method 402 that includes, but is not limited to, step 440 of method 400. All of 430-436 and 442 shown in FIG. 11 are considered optional, but in embodiments may be helpful, in execution of method 400 to achieve useful wafer processing results.

Step 430 sets up equipment characteristics that are related to the second center-to-edge process variation, which will be produced at step 440. For example, when 440 is expected to introduce the controlled variation, 430 may involve providing equipment parameters such as heater settings that will provide a controlled center-to-edge temperature variation. Equipment such as described in FIGS. 2-8 herein is useful in providing a controlled center-to-edge temperature variation. Step 432 measures equipment characteristics that are related to the second center-to-edge process variation. In consideration of process knowledge, as discussed above, method 402 may optionally return from 432 to 430 to adjust equipment characteristics in light of the equipment characteristics measured in 432. Step 434 processes one or more test wafers that receive the second center-to-edge process variation; the test wafer(s) processed in 434 may include one or more test wafers saved from the first process step in 418, above. Step 436 measures one or more characteristics of the second center-to-edge process variation on the test wafer(s) processed in 434. In consideration of previously acquired process knowledge, method 402 may optionally return from 436 to 430 to adjust equipment characteristics in light of the center-to-edge process characteristics measured in 436.

Step 440 processes a product wafer with the second center-to-edge process variation. Also, although not shown in method 402, additional test wafers could certainly be processed in parallel with the product wafer. Step 442 measures one or more first center-to-edge characteristics on the product wafer, to generate data for equipment process control purposes, for correlation to yield or performance of the product wafer, and/or for use in correlating to information surrounding 420, as described above. Such measurements could also be performed on any test wafer that was processed in parallel with the product wafer, but in any case 442 will generally not further alter any condition present on the product wafer. That is, the results of 420 and 440 will be fixed in the product wafer at the conclusion of 440 irrespective of any further testing done.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Plasma processing of workpieces other than wafers may also benefit from improved processing uniformity, and are considered within the scope of the present disclosure. Thus, characterization of the chucks herein as "wafer chucks" for holding "wafers" should be understood as equivalent to chucks for holding workpieces of any sort, and "wafer processing systems" as similarly equivalent to processing systems.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A workpiece holder comprising:
a substantially cylindrical puck, wherein the puck forms a protrusion;
a first heating device disposed in thermal communication with a radially inner portion of the puck;
a second heating device disposed in thermal communication with a radially outer portion of the puck, wherein the first and second heating devices are independently controllable with respect to one another, and wherein at least one of the first heating device and the second heating device is disposed within a groove defined within a bottom surface of the puck;

a thermal sink disposed in thermal communication with the puck, wherein the first and second heating devices are in greater respective degrees of thermal communication with the puck than a degree of thermal communication of the thermal sink with the puck;

a fastener coupled with the protrusion; and a wave washer disposed about the fastener between the thermal sink and the protrusion, the wave washer having a net uncompressed thickness that is at least twice its compressed thickness.

2. The workpiece holder of claim 1, wherein at least one of the first heating device and the second heating device comprises a resistive heater.

3. The workpiece holder of claim 2, further comprising a heater cap that is placed within the groove to hold the resistive heater in place, the heater cap being secured to the puck along at least part of an arc length of the resistive heater.

4. The workpiece holder of claim 1, wherein the puck couples mechanically and thermally with the thermal sink at a plurality of attachment points, wherein for at least one of the attachment points:
the protrusion faces the thermal sink;
the thermal sink forms an aperture; and
the fastener passes through the aperture and couples within the protrusion.

5. The workpiece holder of claim 4, wherein the plurality of attachment points provide substantially all of the thermal communication of the thermal sink with the puck.

6. The workpiece holder of claim 4, wherein the puck is at least ten inches in diameter and the plurality of attachment points comprise at least twenty attachment points.

7. The workpiece holder of claim 6, wherein the puck is at least twelve inches in diameter and the plurality of attachment points comprise at least thirty attachment points.

8. The workpiece holder of claim 4, wherein at the at least one of the attachment points:
the protrusion defines a first lateral extent, and
the thermal sink defines a thinned portion that is reduced in thickness around the aperture, the thinned portion having a second lateral extent that is greater than the first lateral extent, such that a lateral gap exists between the protrusion and a full thickness portion of the thermal sink.

9. The workpiece holder of claim 8, wherein the thermal sink defines one or more voids adjacent to the aperture and within the thinned portion, to limit thermal transfer from the puck to the thermal sink.

10. The workpiece holder of claim 1, wherein the thermal sink comprises a metal plate that defines one or more fluid channels, and a heat exchange fluid flows through the fluid channels to define a reference temperature of the thermal sink.

11. The workpiece holder of claim 1, wherein the thermal sink comprises a metal plate that defines one or more fluid channels, and wherein a heat exchange fluid flows through the one or more fluid channels to define a reference temperature of the thermal sink.

12. The workpiece holder of claim 1, wherein the puck is characterized by a cylindrical axis, a puck radius about the cylindrical axis, and a puck thickness, and wherein at least a top surface of the substantially cylindrical puck is substantially planar.

13. The workpiece holder of claim 12, wherein the substantially cylindrical puck defines one or more radial thermal breaks between the radially inner and radially outer portions of the puck.

14. The workpiece holder of claim 13, wherein each thermal break is characterized as a radial recess that intersects at least one of the top surface and a bottom surface of the substantially cylindrical puck.

15. The workpiece holder of claim 14, wherein the radial recess is characterized by:
a thermal break depth that extends from the top surface or the bottom surface of the puck through at least half of the puck thickness,
and a thermal break radius that is disposed symmetrically about the cylindrical axis, and is at least one-half of the puck radius.

16. A workpiece holder comprising:
a substantially cylindrical puck that is characterized by a cylindrical axis and a substantially planar top surface, wherein the puck defines two radial thermal breaks and a protrusion, wherein:
a first one of the thermal breaks being characterized as a radial recess that intersects a bottom surface of the puck at a first radius, and
a second one of the thermal breaks being characterized as a radial recess that intersects the top surface of the puck at a second radius that is greater than the first radius, and
wherein the first one of the thermal breaks and the second one of the thermal breaks each cross a plane through the puck parallel with the top surface and the bottom surface of the puck;
a thermal sink;
a fastener coupled with the protrusion; and
a wave washer disposed about the fastener between the thermal sink and the protrusion, the wave washer having a net uncompressed thickness that is at least twice its compressed thickness.

17. The workpiece holder of claim 16, wherein the first and second thermal breaks define a demarcation between a radially inner portion of the puck and a radially outer portion of the puck.

18. The workpiece holder of claim 17, wherein the puck comprises:
a first heating device embedded within the radially inner portion of the puck, and
a second heating device embedded within the radially outer portion of the puck.

19. The workpiece holder of claim 18, wherein the workpiece holder further comprises a thermal sink that extends substantially beneath the bottom surface of the puck, the thermal sink comprising a metal plate that flows a heat exchange fluid through channels defined therein, to maintain a reference temperature for the puck, and wherein the thermal sink mechanically and thermally couples with the puck at a plurality of attachment points that provide a degree of thermal communication between the thermal sink and the puck that is less than a degree of thermal communication between each of the first and second heating devices and the puck.

* * * * *